United States Patent [19]

Ester

[11] 4,045,693
[45] Aug. 30, 1977

[54] NEGATIVE R-S TRIGGERED LATCH

[75] Inventor: Gary W. Ester, Redwood City, Calif.

[73] Assignee: GTE Automatic Electric Laboratories Incorporated, Northlake, Ill.

[21] Appl. No.: 703,404

[22] Filed: July 8, 1976

[51] Int. Cl.² .......................................... H03K 3/286
[52] U.S. Cl. ................................... 307/291; 307/215; 307/247 R; 328/195; 328/196; 328/206
[58] Field of Search ................... 307/291, 247 R, 215; 328/195, 196, 206

[56] References Cited

U.S. PATENT DOCUMENTS

| 3,001,140 | 9/1961 | Beck | 328/195 X |
| 3,467,839 | 9/1969 | Miller | 307/215 X |
| 3,508,079 | 4/1970 | Moll et al. | 328/195 X |
| 3,845,325 | 10/1974 | Daniels et al. | 307/215 X |
| 3,895,240 | 7/1975 | Kawagoe | 307/291 X |
| 3,976,949 | 8/1976 | Hepworth et al. | 328/206 |

Primary Examiner—John S. Heyman
Attorney, Agent, or Firm—Leonard R. Cool; Russell A. Cannon

[57] ABSTRACT

A negative, edge-triggered R-S latch, which provides predetermined output states for any and all R-S inputs, may be obtained by using an AND-OR-Invert (A-O-I) circuit in conjunction with a "D"-type flip-flop. The reset input and the Q-output of the flip-flop provide the inputs to one AND-gate of the A-O-I circuit. The set input and $\bar{Q}$-output of the flip-flop provide the inputs to the other AND-gate. The output of the A-O-I provides the clock input to the flip-flop. The $\bar{Q}$-output is also connected to the D-input of the flip-flop.

6 Claims, 2 Drawing Figures

NEGATIVE R-S TRIGGERED LATCH

BACKGROUND OF THE INVENTION

1. Field of the Invention

This invention relates to R-S latches and in particular to an R-S latch which has no indeterminate state for any binary logic output signal condition.

2. Description of the Prior Art

R-S latches are well known and also may be known as R-S bistable multivibrators or R-S flip-flops. For a discussion of R-S flip-flops, reference should be made to the text, "Introduction to Switching Theory and Logical Design," Hill, F. J. And Peterson, G. R. John Wiley & Sons, Inc., second ed., pp. 213 – 215, which is incorporated herein by reference. As explained in the reference, a pulse on the S-input will "set" the flip-flop, i.e., drive the Q-output to the H or 1 level and the $\overline{Q}$-output to the L or 0 level. A pulse on the (clear) reset line will reset the flip-flop, i.e., drive the Q-output to the L or 0 level and the $\overline{Q}$-output to the H or 1 level. A problem occurs with the R-S latch (flip-flop) if a pulse should be applied to both at the same time. Thus, in normal operation, R-S flip-flops (latches) of the prior art necessarily required that both the R and S inputs should not be permitted to have pulses applied to both inputs at the same time. The rationale is: (1) if pulses are applied to both inputs, both outputs will be driven to 0, which violates the basic definition of flip-flop operation, which definition requires that the output should always be the complements of each other; and (2) if both inputs have pulses applied and the pulses are removed at the same time, the prior-art R-S latch will try to make both outputs equal to 1. Because of feedback it is not possible for both outputs to go to 1 at the same time. Thus, the flip-flop (latch) output is not predictable and may even oscillate.

These disadvantages are partially overcome by the circuit disclosed and claimed in U.S. Pat. No. 3,895,240 entitled, "Set Preferring R-S Flip-Flop Circuit." Here the circuit is identified as an R-S-S flip-flop circuit. The R-S-S is suited for use in which both R and S inputs may become 1 at the same time. Since on such an occurrence the set input is given preference, the output is not indeterminate as would occur with a standard R-S flip-flop. Thus, there is no need to inhibit the occurrence of simultaneous pulse inputs to this R-S-S latch. Such a circuit operates on the leading edge or positive transition of the input state(s), and on the occurrence of simultaneous pulse inputs the circuit will always return to the set state.

SUMMARY OF THE INVENTION

A negative, edge-triggered R-S latch which provides predetermined output states for all R and S input conditions.

DETAILED DESCRIPTION

Figure 1:
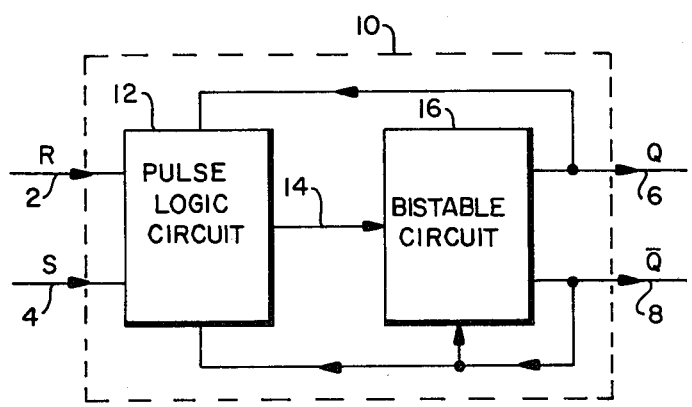
FIG. 1 is a block diagram of an R-S latch in accordance with the teaching of this invention.

Referring to FIG. 1, the R and S inputs are applied to a pulse logic circuit 12. The Q and $\overline{Q}$-outputs are fed back from the output of bistable circuit 16 to additional inputs of the pulse logic circuit 12. The output of logic 12 is a clock signal which only in transition from a first state to a second state causes bistable means to change state. The truth table for the R-S latch is given in Table I below.

Table I
TRUTH TABLE
Negative Edge-Triggered R-S Latch

| INPUTS | | OUTPUTS | |
|---|---|---|---|
| SET | RESET | Q | $\overline{Q}$ |
| ↓ | X | H | L |
| X | ↓ | L | H |
| ↓ | ↓ | TOGGLE | |
| H | H | Q* | $\overline{Q}$ |
| H | L | Q | $\overline{Q}$ |
| L | H | Q | $\overline{Q}$ |
| L | L | Q | $\overline{Q}$ |
| H | ↑ | Q | $\overline{Q}$ |
| L | ↑ | Q | $\overline{Q}$ |
| ↑ | H | Q | $\overline{Q}$ |
| ↑ | L | Q | $\overline{Q}$ |

Figure 2:
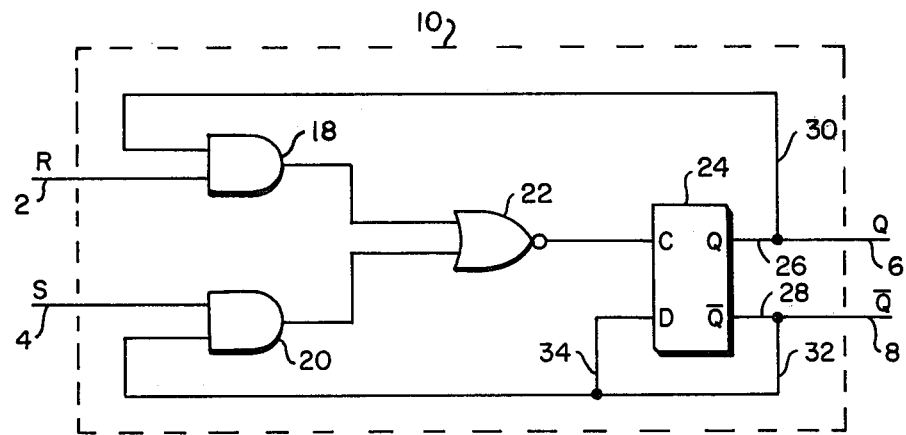
FIG. 2 is a block diagram illustrating a preferred embodiment of the invention implemented with standard logic circuits.

H High level
L Low Level
X Don't care
↓ Negative-going edge
↑ Positive-going edge
*No change in output A preferred embodiment of the negative, edge-triggered R-S latch is illustrated in FIG. 2. The circuit responds only to negative transitions on the inputs, and not to positive transitions or fixed levels. First, assume the R-S latch is in the reset state, i.e., Q-L, $\overline{Q}$-H, and both set and reset inputs are high. The L from the Q-output is fed back to gate 18, and the high from the $\overline{Q}$-output is fed back to gate 20. This forces the output of gate 18 to L, the output of gate 20 to H, and the output of NOR-gate 22 to L. Now, if the reset input goes from H to L, there will be no change as the Q-input to gate 18 holds its output L. If the set input goes to L, the output of gate 20 will go to L, and the output of gate 22 will go to H. The D flip-flop 24 is connected, D-input to $\overline{Q}$-output via path 28, 32, and 34 so it will toggle when the clock input goes positive, i.e., on a positive transition. Therefore, when the set input goes low, the output will change to the set condition, i.e., Q-H and $\overline{Q}$-L. Any further change by the set input will have no effect as the L at the $\overline{Q}$-input to gate 20 will hold the output of said gate to L. If the reset input is low, the output of gate 18 will be L and the output of gate 22 will be H. Now, when the reset input goes to H, the output of gate 18 will go to H, and the output of gate 22 will go to L. Thus, there will be no change in the output. But now when the reset input goes low, the output of gate 18 will go to L and the output of gate 22 will go to H. Now there will be a change, and the outputs of the D flip-flop will return to the reset condition, i.e., Q-L and $\overline{Q}$-H. It can be seen that if the set and reset inputs occur alternately, the outputs will toggle. It can also be seen that if the set and reset inputs occur simultaneously, the output will also toggle. If the R-S latch is in the reset condition and both set and reset inputs occur simultaneously, the reset input will be ignored and the set input will cause the outputs to go to the set condition. If both inputs occur simultaneously again, the set input will be ignored and the reset input will cause the outputs to go to the reset condition.

What is claimed is:

1. A negative, edge-triggered R-S latch which provides predetermined outputs states for all R and S input conditions, said latch comprising:

an R-input;
an S-input;
a Q-output;
a $\overline{Q}$-output;
pulse logic means having an output and having only R, S, Q, an $\overline{Q}$-inputs; said pulse logic means logically combining said inputs to provide a binary output depending upon the states of the inputs; and
bistable means having as one input the $\overline{Q}$-output and having as a second input the output of said pulse logic means, said bistable means being responsive only to the transitions between a first state and a second state of the binary output of said pulse logic means, said transitions changing the state of the Q and $\overline{Q}$-outputs.

2. A latch according to claim 1 in which said pulse logic means further comprises:
a first gating means having R, S, Q, and $\overline{Q}$-inputs and providing one binary output, the state of which depends upon the state of the R and Q-inputs and providing a second binary output, the state of which depends upon the states of the S and $\overline{Q}$-inputs; and
a second gating means having two inputs, one connected to said one binary output and the second connected to said second binary output of said first gating means, and providing a transition only between a first binary state and a second binary state when the inputs change to become one like state from any other combination of the binary input states.

3. A latch in accordance with claim 2 wherein said bistable means further comprises:
an edge-triggered "D"-type flip-flop.

4. A latch in accordance with claim 3 wherein said first gating means further comprises:
a first AND-gate having a pair of inputs, one connected to the R-input and one connected to the Q-output of the bistable means; and
a second AND-gate having a pair of inputs, one connected to the S-input and one connected to the $\overline{Q}$-output of the bistable means.

5. A latch according to claim 4 wherein said second gating means is a NOR-gate.

6. A negative, edge-triggered R-S latch which provides predetermined output states for all R and S input conditions, said latch comprising:
a first AND-gate having two inputs and an output, one said input accepting the R-input;
a second AND-gate having two inputs and an output, one said input accepting the S-input;
a NOR-gate having two inputs and an output, one said input being connected to the output of said first AND-gate and the other said input being connected to the output of the second AND-gate;
a D-type, edge-triggered flip-flop having Q and $\overline{Q}$-outputs and having the clock input connected to the output of said NOR-gate, the D-input connected to the $\overline{Q}$-output, said Q-output being connected to the other input of said first AND-gate and the $\overline{Q}$-output also being connected to the other input of said second AND-gate.

* * * * *